US006703856B2

(12) United States Patent
Fujita

(10) Patent No.: US 6,703,856 B2
(45) Date of Patent: Mar. 9, 2004

(54) TEST METHOD OF ELECTRO-OPTICAL DEVICE, TEST CIRCUIT OF ELECTRO-OPTICAL DEVICE, ELECTRO-OPTICAL DEVICE, AND ELECTRONIC EQUIPMENT

(75) Inventor: Shin Fujita, Suwa (JP)

(73) Assignee: Seiko Epson Corporation, Ltd., Tokyo (JP)

( * ) Notice: Subject to any disclaimer, the term of this patent is extended or adjusted under 35 U.S.C. 154(b) by 6 days.

(21) Appl. No.: 09/994,675

(22) Filed: Nov. 28, 2001

(65) Prior Publication Data

US 2002/0070750 A1 Jun. 13, 2002

(30) Foreign Application Priority Data

Dec. 7, 2000 (JP) ....................................... 2000-372839

(51) Int. Cl.[7] ................................................ G01R 31/00
(52) U.S. Cl. ......................................... 324/770; 345/87
(58) Field of Search .............................. 324/770, 158.1, 324/550, 768, 769, 753, 548; 345/87, 97, 98, 99, 212; 315/169.1, 169.2

(56) References Cited

U.S. PATENT DOCUMENTS 5,576,730 A 11/1996 Shimada et al.
6,169,532 B1 * 1/2001 Sumi et al. ................... 345/98
6,483,493 B2 * 11/2002 Murade ....................... 345/87

FOREIGN PATENT DOCUMENTS

JP 11-271806 A 8/1999
WO WO 92/15891 9/1992

* cited by examiner

*Primary Examiner*—Evan Pert
*Assistant Examiner*—Trung Q. Nguyen
(74) *Attorney, Agent, or Firm*—Oliff & Berridge, PLC

(57) ABSTRACT

The invention performs an accurate testing in order to determine the presence or absence of a defect in a wiring and electrodes in an electro-optical device. A test method is provided for testing an electro-optical device that includes a capacitor arranged at an intersection of each scanning line and each data line. A test switching element connected between the data line and a reading signal-line is turned on after storing a charge responsive to a data signal in the capacitor so that the voltage responsive to the charge stored in the capacitor is output to the reading signal-line. The timing of switching on the test switching element is set to be different from the timing of a level change of a test clock pulse that defines the operation of a test circuit.

16 Claims, 10 Drawing Sheets

[FIG. 1]
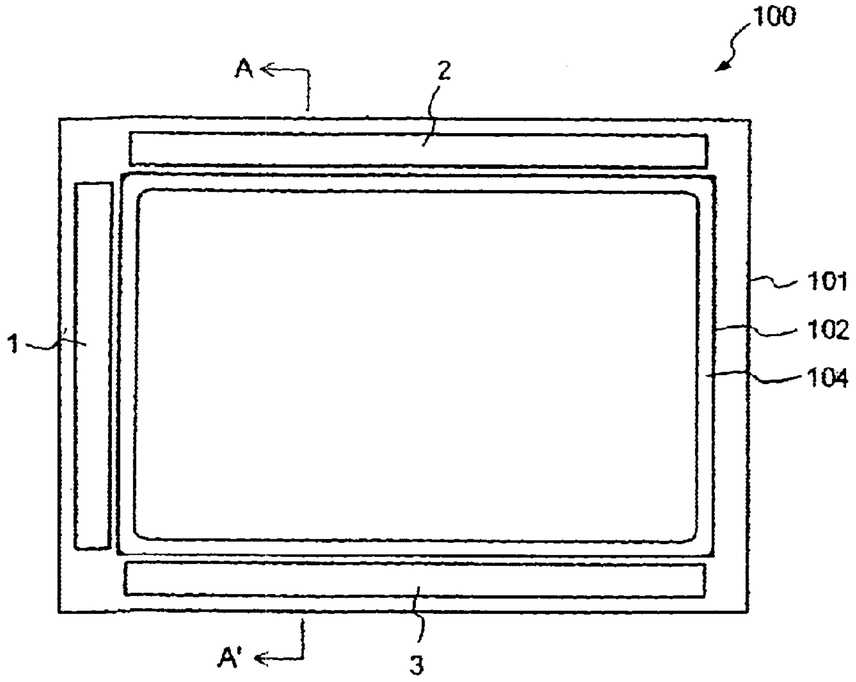
[FIG. 2]
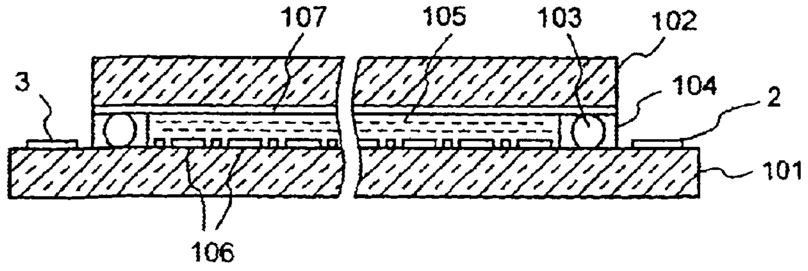

[FIG. 3]
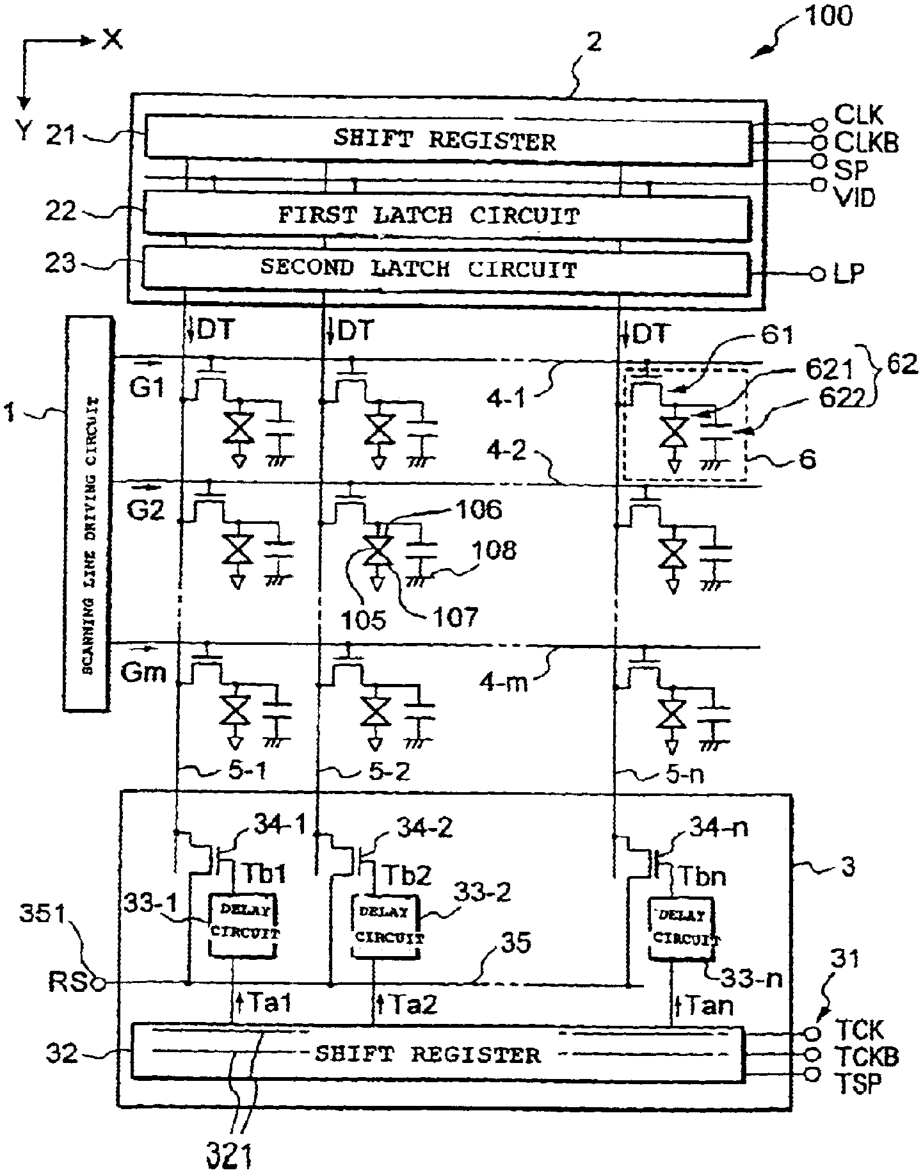

[FIG. 4]
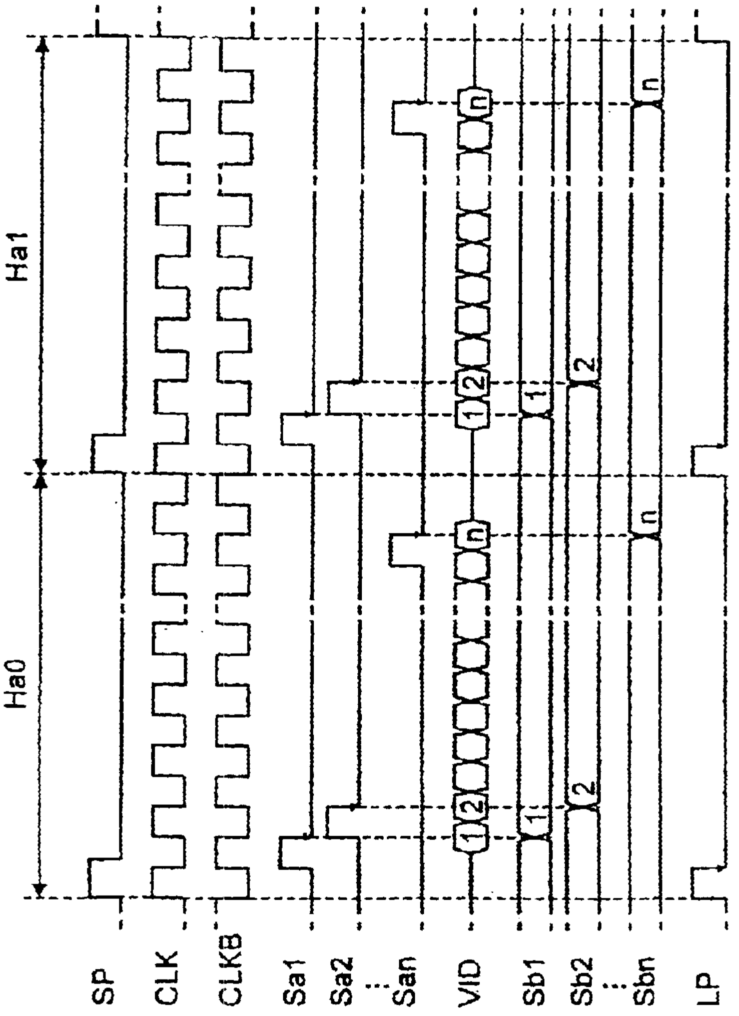

[FIG. 5]
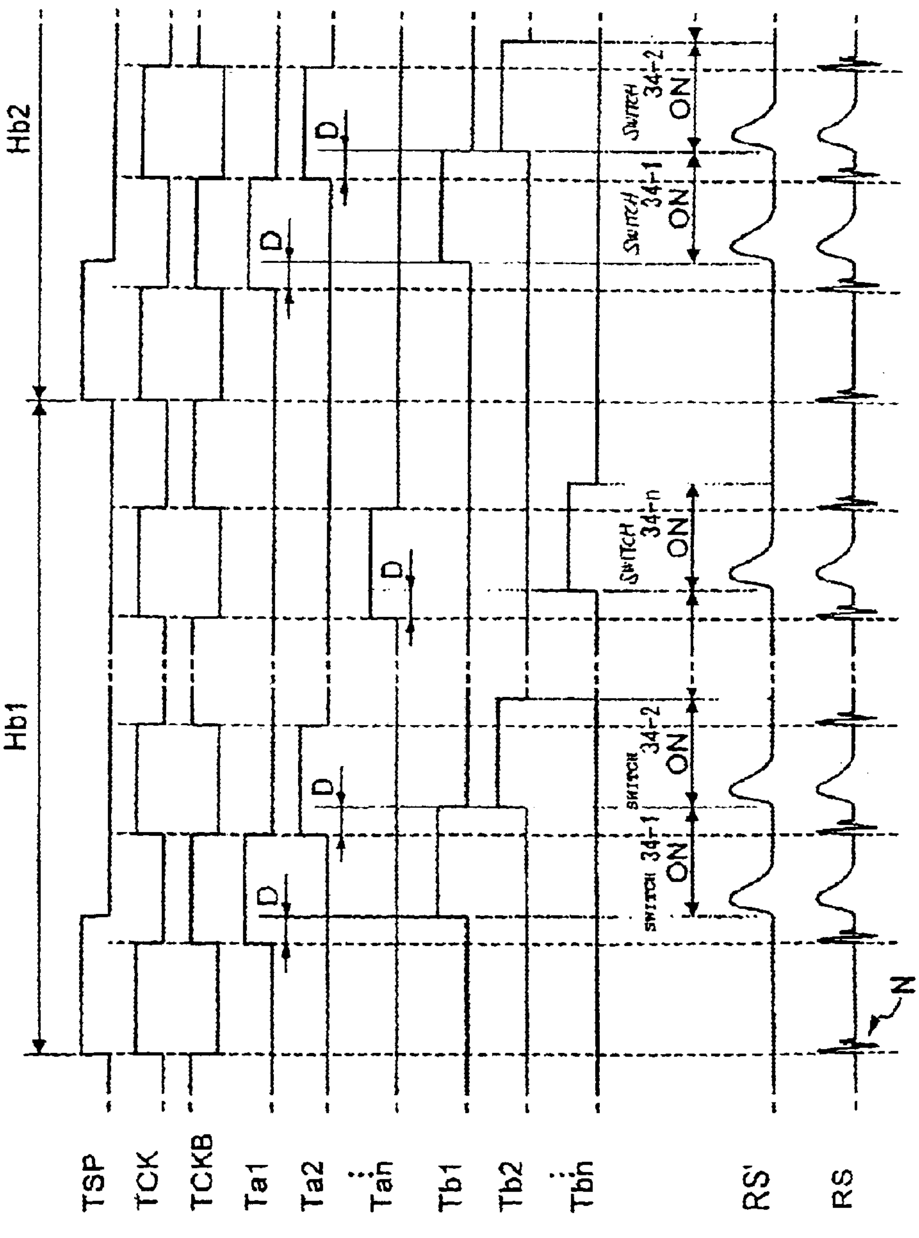

[FIG. 6]
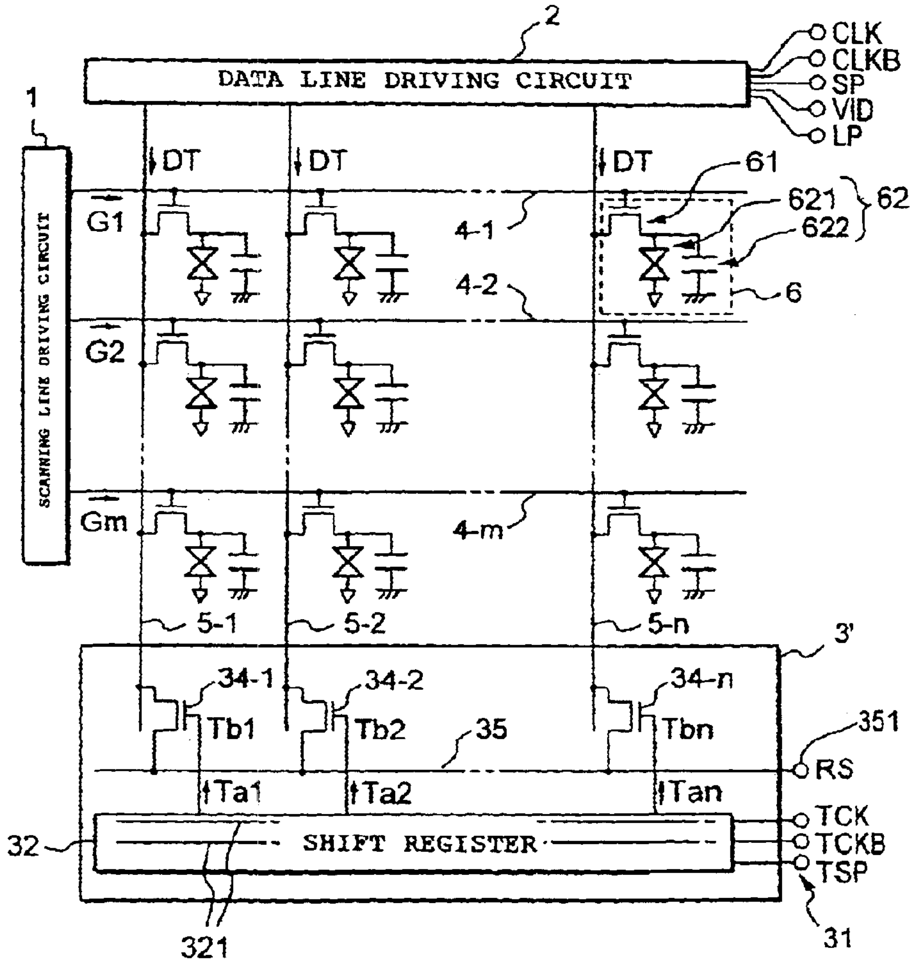

[FIG. 7]
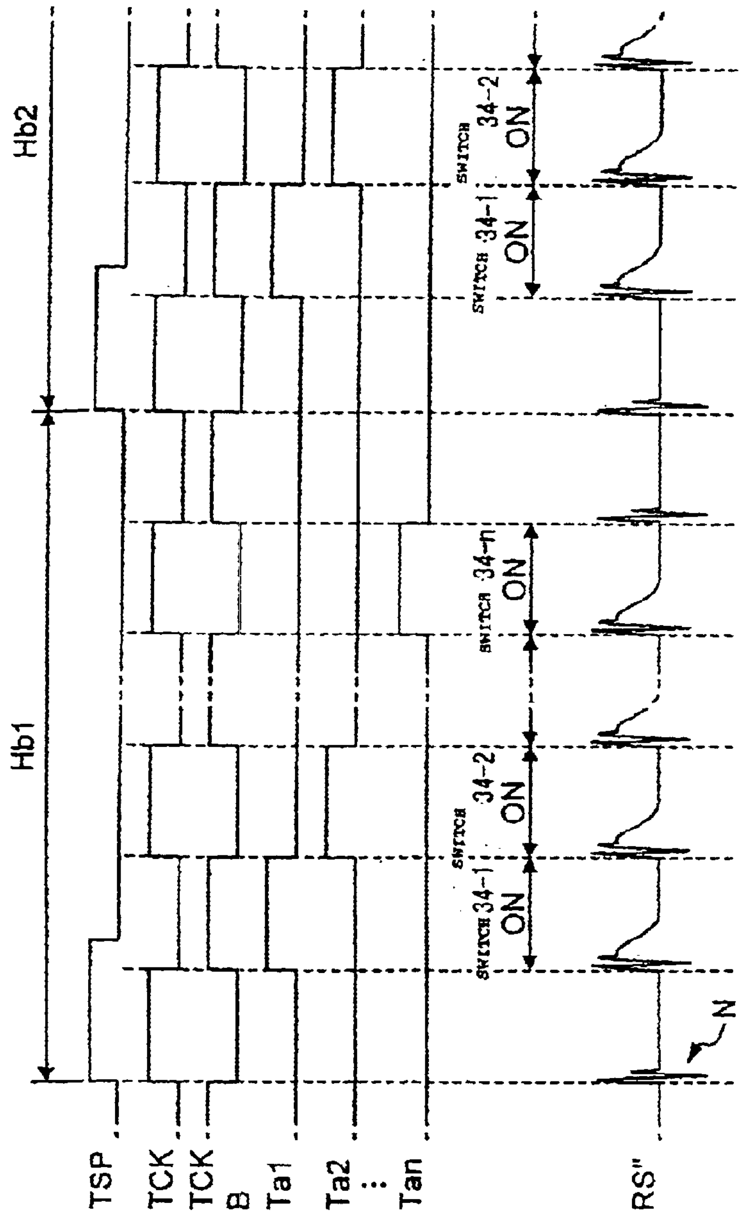

[FIG. 8]
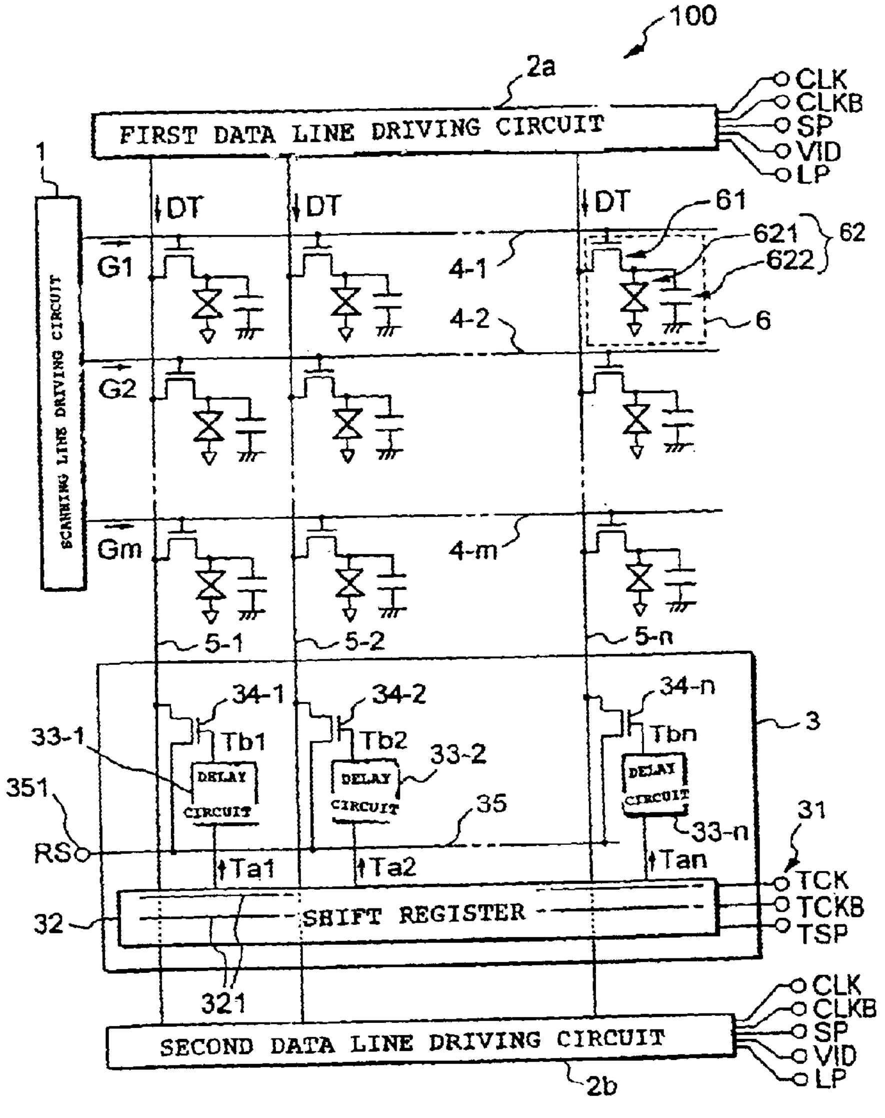

[FIG. 9]
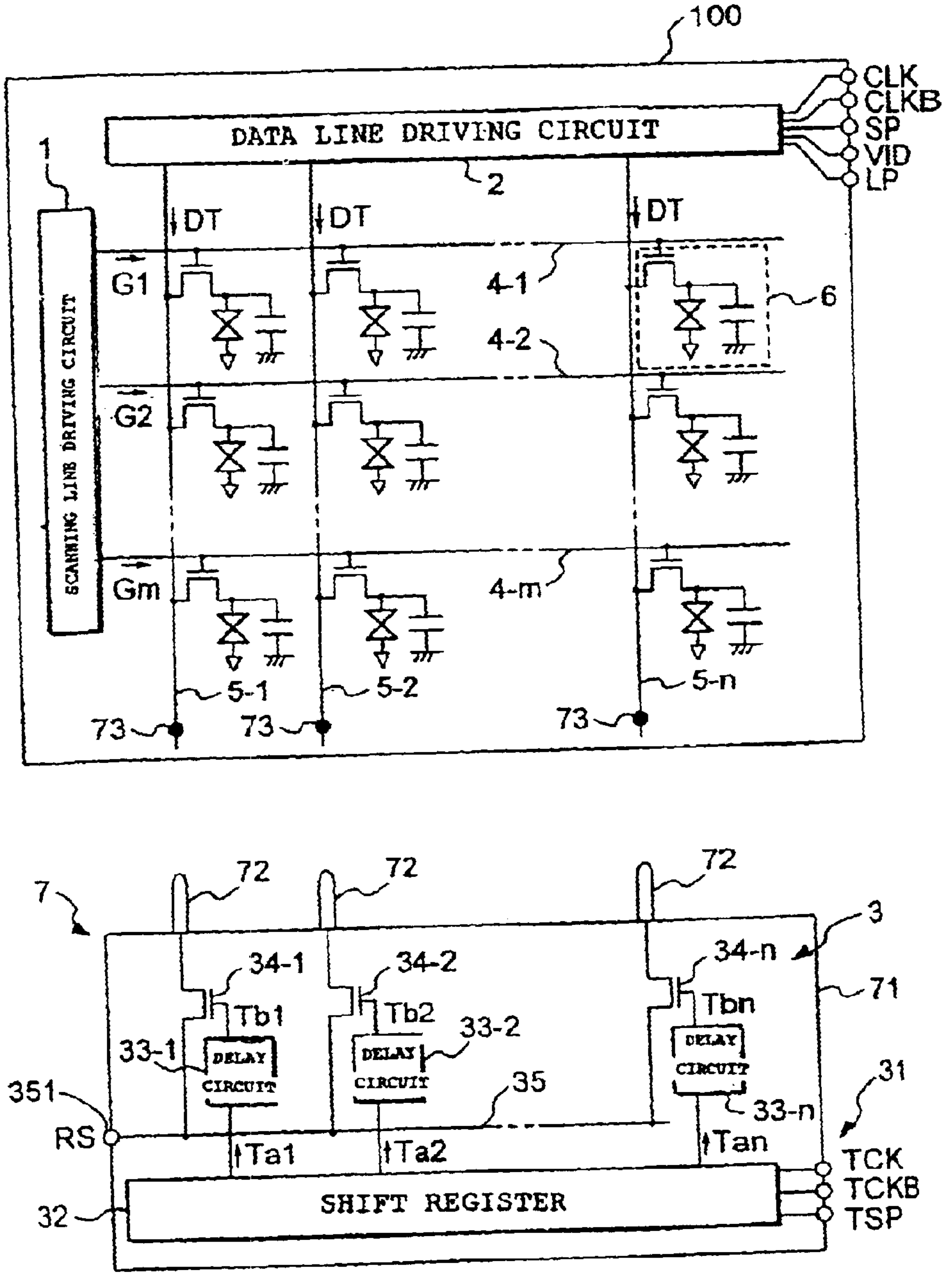

[FIG. 10]
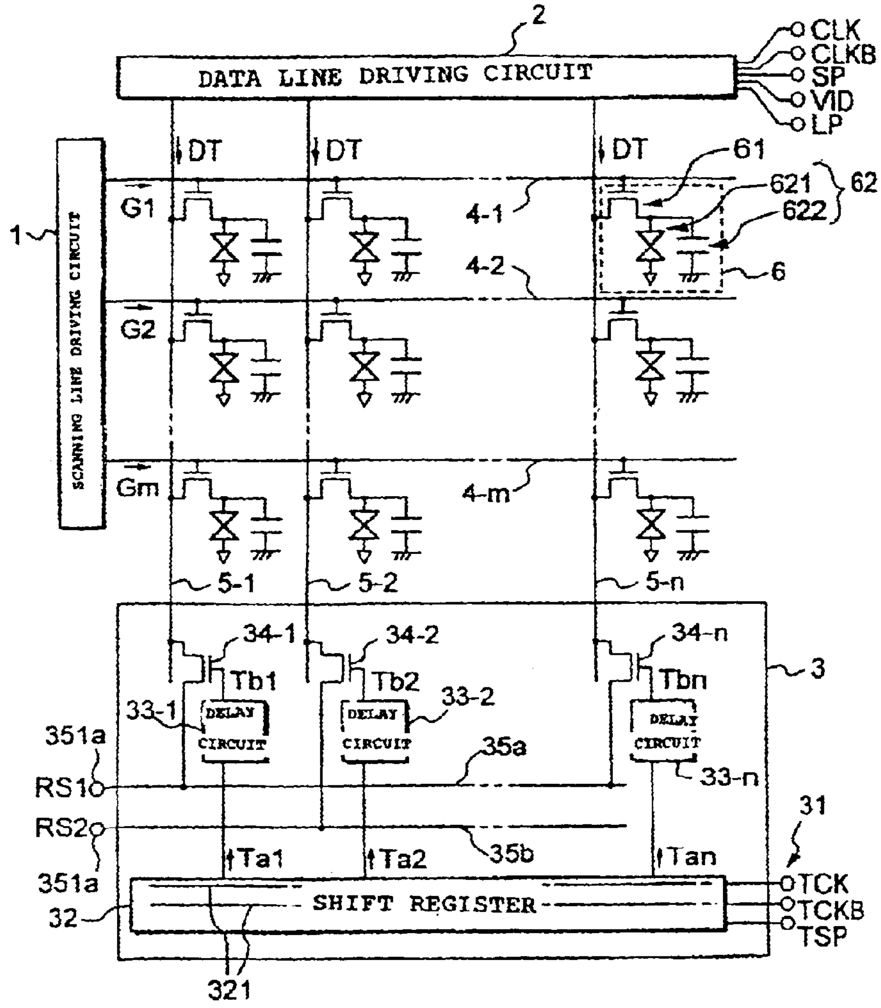

[FIG. 11]
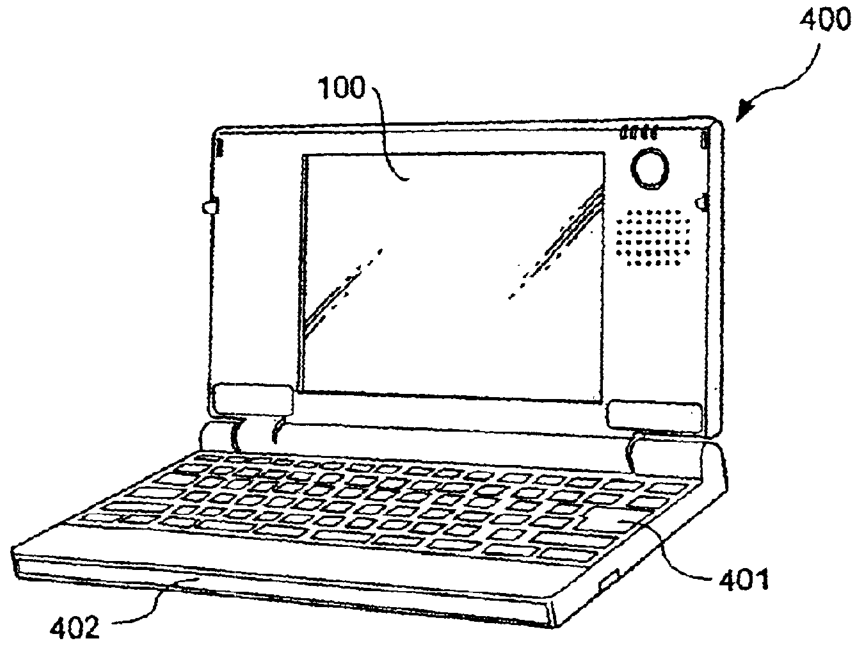
[FIG. 12]
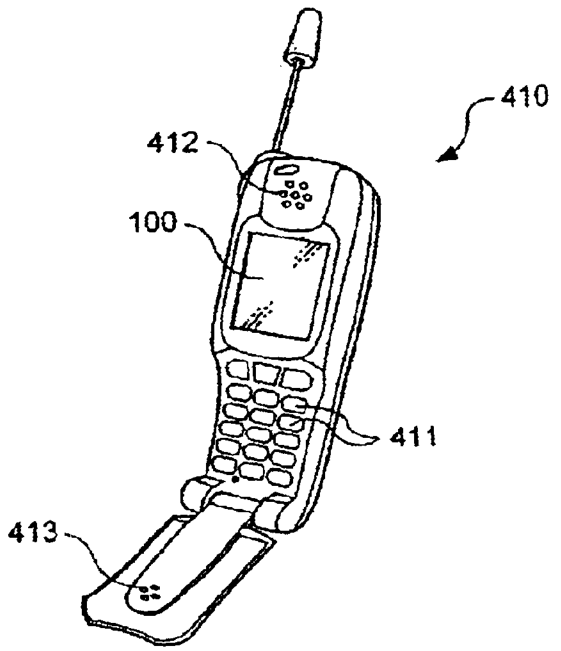

TEST METHOD OF ELECTRO-OPTICAL DEVICE, TEST CIRCUIT OF ELECTRO-OPTICAL DEVICE, ELECTRO-OPTICAL DEVICE, AND ELECTRONIC EQUIPMENT

BACKGROUND OF THE INVENTION

1. Field of Invention

The present invention relates to a test method of an electro-optical device, a test circuit of the electro-optical device, the electro-optical device, and electronic equipment.

2. Description of Related Art

Electro-optical devices, such as liquid-crystal devices, are currently being widely used as display devices for many diverse types of electronic equipment. An electro-optical device of this sort typically includes an element substrate having a plurality of scanning lines and a plurality of data lines formed thereon, a counter substrate facing the element substrate, an electro-optical material sandwiched between the two substrates, and pixels, each pixel being arranged at an intersection of each of the scanning lines and each of the data lines.

It is extremely difficult to completely remove an open circuit or a short circuit of wirings of the scanning line or the data line, and defects in a pixel or a switching element (hereinafter collectively referred to as a "defect") in a manufacturing process of the electro-optical device. A certain number of defects inevitably occur. Manufactured electro-optical devices thus must be tested for the presence or absence of any defect. In a known test method, for example, a test pattern, displayed on an electro-optical device to be tested, is observed with a user's naked eyes or by using a CCD camera to determine whether each pixel lights normally.

SUMMARY OF THE INVENTION

When the area of each pixel is very small, such as on a high-definition display, it is difficult to precisely recognize each of the pixels with a user's naked eyes or by using a CCD camera. When a defect in a pixel causes a difference between a voltage supplied to the pixel and an intended voltage, a density difference on the screen due to the voltage difference is difficult to recognize. Such a defect in the pixel cannot be easily found. The conventional test method is thus subject to an accuracy limit.

The present invention addresses the above problem, and it is an object of the present invention to provide a test method and test circuit of an electro-optical device, the electro-optical device, and electronic equipment that enables wirings and electrodes to be accurately tested to check for the presence or absence of defects therewithin.

To address the above problem, a test method is provided to test an electro-optical device using a test circuit which operates in response to an action command signal periodically changing the level thereof. The electro-optical device includes a pixel electrode which is arranged at an intersection of each of scanning lines and each of data lines and serves as one electrode of a capacitor, and a pixel switching element connected between the pixel electrode and the data line. The test method includes a first step of supplying the pixel electrode with a data signal by turning on the pixel switching element, a second step of turning on a test switching element at a timing delayed from a timing of a level change of the action command signal in the course of outputting a voltage supplied to the pixel electrode to a reading signal-line by using the test circuit, and a third step of determining whether the voltage output to the reading signal-line corresponds to a voltage responsive to the data signal supplied to the pixel electrode.

Since the test method feeds the voltage applied to the pixel electrode to the reading signal-line and determines whether the fed voltage corresponds to the voltage responsive to the data signal supplied to the pixel electrode, the presence or absence of a defect in any of the pixel electrode, a pixel switching element, a scanning line and a data line in the electro-optical device is correctly detected. Even when a noise, occurring in response to a change in level of the action command signal, is superimposed on the voltage supplied to the reading signal-line, the voltage actually supplied to the pixel electrode is accurately detected because the timing of turning on the test switching element is different from the timing of the level change of the action command signal. Accurate testing is performed without being influenced by the noise.

To address the above-referenced problem, a test circuit is provided to test an electro-optical device including a pixel electrode which serves as one electrode of a capacitor and is arranged at an intersection of each of scanning lines and each of data lines, and a pixel switching element connected between the pixel electrode and the data line. The test circuit outputs a voltage, supplied to the pixel electrode, to a reading signal-line after supplying the data signal to the pixel electrode by turning on the pixel switching element, in order to determine whether the voltage supplied to the pixel electrode corresponds to a voltage responsive to the data signal. The test circuit includes a test switching element connected between the data line and the reading signal-line, and a control circuit which operates in response to the action command signal periodically changing the level thereof, and which turns on the test switching element at a timing delayed from a timing of a level change of the action command signal.

Since the test circuit determines whether the voltage fed to the reading signal-line corresponds to the voltage responsive to the data signal supplied to the pixel electrode, the presence or absence of a defect in the electro-optical device is correctly detected in the same way as described in connection with the above-referenced test method. Furthermore, even when a noise takes place at the timing of the level change of the action command signal, the test circuit accurately detects the voltage supplied to the pixel electrode because the timing of outputting the voltage, supplied to the pixel electrode, to the reading signal-line is different from the timing of the level change of the action command signal. The use of the test circuit enables testing to be accurately performed without being influenced by the noise. The test circuit may be arranged on the substrate of the electro-optical device, as part of the electro-optical device, or may be a device that is separate from the electro-optical device.

Preferably, in the test circuit, the control circuit turns on the test switching element at a timing delayed from the timing of the level change of the action command signal by a duration of time falling within a range from one-eighth to one-quarter the period of the action command signal. When the timing of turning on the test switching element is delayed by a duration of time equal to half the period of the action command signal, the noise is superimposed on the voltage supplied to the reading signal-line, and the voltage supplied to the pixel electrode is not accurately detected. The noise has a predetermined width along the time axis. In view of these points, the timing of turning on the test switching element is preferably set to be within the above-mentioned range to exclude the effect of the noise and to accurately detect the voltage supplied to the pixel electrode.

In the test circuit, an input terminal that inputs the action command signal to the control circuit and an output terminal of the reading signal-line are preferably arranged on opposed ends of the control circuit. This arrangement shortens a portion of the reading signal-line routed out toward the input terminal, thereby reducing noise that is caused by a capacitive coupling between the reading signal-line and the wiring that feeds the action command signal.

The control circuit preferably includes an output device that outputs a control signal that changes the level thereof in response to the action command signal, and a timing modification device that delays the timing of the level change of the control signal from the timing of the level change of the action command signal. The output device can be a shift register operating in response to a clock signal as the action command signal, or an address decoder operating in response to an address signal as the action command signal. The timing modification device can be a delay device that delays the control signal, for example.

To address the previously mentioned problem, a test circuit is provided that tests an electro-optical device including a pixel electrode which is arranged at an intersection of each of scanning lines and each of data lines and serves as one electrode of a capacitor, and a pixel switching element connected between the pixel electrode and the data line. The test circuit outputs a voltage, supplied to the pixel electrode, to a reading signal-line after supplying a data signal to the pixel electrode by turning on the pixel switching element, in order to determine whether the voltage supplied to the pixel electrode corresponds to a voltage responsive to the data signal. The test circuit includes a test switching element connected between the data line and the reading signal-line, and a control circuit which turns on the test switching element in response to an action command signal periodically changing the level thereof, an input terminal that inputs the action command signal to the control circuit, and an output terminal, arranged on the end of the control circuit opposite to the input terminal, that outputs a voltage of the reading signal-line. Since the input terminal and the output terminal are arranged on opposite ends of the control circuit, the generation of noise arising from capacitive coupling is controlled.

The test circuit can be incorporated into the electro-optical device. Specifically, an electro-optical device is provided that includes a pixel electrode, arranged at an intersection of each of scanning lines and each of data lines and serving as one electrode of a capacitor, a pixel switching element connected between the pixel electrode and the data line, and a test circuit which outputs a voltage, supplied to the pixel electrode, to a reading signal-line after supplying a data signal to the pixel electrode by turning on the pixel switching element, in order to determine whether the voltage supplied to the pixel electrode corresponds to a voltage responsive to the data signal. The test circuit includes a test switching element connected between the data line and the reading signal-line, and a control circuit which operates in response to the action command signal periodically changing the level thereof, and which turns on the test switching element at a timing delayed from a timing of a level change of the action command signal.

As in the above-referenced test circuit, the control circuit in the electro-optical device may have a structure that enables the test switching element to turn on at a timing delayed from the timing of the level change of the action command signal by a duration of time falling within a range from one-eighth to one-quarter the period of the action command signal, or may have a structure which includes an input terminal that inputs the action command signal to the control circuit and an output terminal, arranged on the end of the control circuit opposite to the input terminal, that outputs a voltage of the reading signal-line. In this way, accurate testing is performed.

The capacitor in the above electro-optical device may be formed of the pixel electrode serving as one electrode, a counter electrode serving as the other electrode, and an electro-optical material sandwiched between the one electrode and the other electrode. In this case, testing is performed when an electro-optical capacitor is formed of an electro-optical material sandwiched between a pixel electrode and a counter electrode in the electro-optical device. As a capacitor that stores charge responsive to the voltage supplied to the pixel electrode, the electro-optical device may include a storage capacitor having one electrode thereof connected to the pixel electrode and the other electrode thereof connected to a capacitive line. In this arrangement, testing can be performed prior to manufacturing the electro-optical device, in other words, at a prior phase of the manufacture of the electro-optical device in which the electro-optical material is just sandwiched between the pixel electrode and the counter electrode. The form of the capacitor is not important as long as a charge that is responsive to the voltage is stored in the capacitor with the pixel electrode as one electrode thereof as a result of applying the voltage responsive to the data signal to the pixel electrode even if neither electro-optical capacitor nor storage capacitor is formed.

Electronic equipment may include the above-referenced electro-optical device. Since accurate testing is performed on the electro-optical device, the electronic equipment incorporating the electro-optical device becomes highly reliable.

BRIEF DESCRIPTION OF THE DRAWINGS

FIG. 1 is a plan view showing the structure of the electro-optical device in accordance with one embodiment of the present invention;

FIG. 2 is a cross-sectional view of the electro-optical device taken along plane A–A' in FIG. 1;

FIG. 3 is a block diagram showing the electrical structure of the electro-optical device;

FIG. 4 is a timing chart showing the operation of the electro-optical device in which a charge is stored in capacitor in each pixel;

FIG. 5 is a timing chart showing the operation of the electro-optical device in which a voltage responsive to a charge stored in a capacitor of each pixel is detected;

FIG. 6 is a block diagram showing another electro-optical device having a structure that is different from the structure of the above-mentioned electro-optical device;

FIG. 7 is a timing chart showing the waveform of the voltage responsive to a charge stored in the capacitor of each pixel detected in the above-mentioned electro-optical device;

FIG. 8 is a block diagram showing the electrical structure of the electro-optical device in accordance with a modification of the embodiment of the present invention;

FIG. 9 is a block diagram showing the structure of a test circuit in the electro-optical device in accordance with a modification of the embodiment;

FIG. 10 is a block diagram showing the electrical structure of the electro-optical device in accordance with a modification of the embodiment;

FIG. 11 is a perspective view showing a personal computer as an example of electronic equipment in which the electro-optical device of the present invention is incorporated;

FIG. 12 is a perspective view showing a mobile telephone as an example of electronic equipment in which the electro-optical device of the present invention is incorporated.

DETAILED DESCRIPTION OF PREFERRED EMBODIMENTS

The electro-optical device in accordance with various exemplary embodiments of the present invention will now be discussed, referring to the drawings. The exemplary embodiments of the present invention are discussed for illustrative purposes only, and are not intended to limit the scope of the present invention. The present invention may be modified within the scope thereof. The electro-optical device to be discussed here, employing a liquid crystal as the electro-optical material, is a liquid-crystal device that has a display taking advantage of an electro-optical change.

<A: Structure of the Embodiments>

FIG. 1 is a plan view showing the structure of the electro-optical device in accordance with the present embodiment. FIG. 2 is a cross-sectional view of the electro-optical device taken along plane A–A' in FIG. 1. As shown in FIGS. 1 and 2, the electro-optical device 100 includes an element substrate 101, and a counter substrate 102, both of which are bonded to each other with a sealing member 104 including a spacer 103 therewithin. A liquid crystal 105 is an electro-optical material that is encapsulated between the two substrates 101, 102. In this embodiment, the element substrate 101 and the counter substrate 102 are manufactured of a material having light transmissivity, such as glass, quartz, or semiconductor. A transmissive-type display is formed by enabling light from the back side to be emitted toward an observing side. Alternatively, a reflective-type display may be formed by enabling light incident from the observing side to be reflected by an opaque substrate.

Referring to FIG. 2, a variety of elements and the pixel electrodes 106 are formed in the internal area of the element substrate 101 (facing the liquid crystal 105) internal to the sealing member 104. A portion of the element substrate 101 extending beyond the edge of the counter substrate 102 bears a scanning line driving circuit 1, a data line driving circuit 2, a test circuit 3, and terminals (not shown) that input various signals to each of these circuits from an external device. The test circuit 3 is used to check the presence or absence of a defect in a pixel in the electro-optical device 100.

The counter substrate 102 has, on the entire inner surface thereof, a counter electrode 107. Also arranged on the inner surface of the counter substrate 102 are a color layer (a color filter), facing the pixel electrodes 106, and a light-shielding film, facing the gap surrounding each pixel electrode 106. However, these elements are not directly related to the present invention, and a detailed discussion is not provided. The inner surfaces of the element substrate 101 and the counter substrate 102 are respectively covered with alignment layers that have been subjected to a rubbing process so that the major axis directions of the molecules of the liquid crystal 105 are continuously twisted between the two substrates. Polarizers (not shown) in accordance with the rubbing process are respectively arranged on the outer surfaces of the two substrates. FIG. 2 shows the pixel electrodes 106 and the counter electrode 107 as being thick. However, these elements are actually extremely thin compared with the thickness of each substrate.

The electrical structure of the electro-optical device 100 in accordance with this embodiment will now be discussed, referring to FIG. 3.

As shown in FIG. 3, the electro-optical device 100 includes m number of scanning lines 4-1, 4-2, . . . , **4-*m* extending in the X (row) direction, and n number of data lines 5-1, 5-2, . . . , 5-*n* extending in the Y (column) direction. One end of each scanning line 4-*i* ($1 \leqq i \leqq m$) is connected to the scanning line driving circuit 1. One end of each data line 5-*j* ($1 \leqq j \leqq n$) is connected to the data line driving circuit 2, and the other end of each data line is connected to the test circuit 3. A pixel 6 is arranged at an intersection of each of the scanning lines 4-*i* and each of the data lines 5-*j*. The pixels 6** in this embodiment are arranged in a matrix of m rows by n columns.

The scanning line driving circuit 1 is what is referred to as a Y shift register. The scanning line driving circuit 1 shifts a pulse signal in response to a predetermined clock signal, thereby successively outputting scanning signals G1, G2, . . . , Gm which respectively and successively select the m number of scanning lines 4-1, 4-2, . . . , **4-*m*** for every horizontal scanning period.

The data line driving circuit 2 supplies the data lines 5-1, 5-2, . . . , **5-*n* with a data signal DT in response to a clock signal CLK, an inverted clock signal CLKB, a start pulse SP, video data VID, and a latch pulse LP supplied from the external device. The data line driving circuit 2 includes a shift register 21, a first latch circuit 22, and a second latch circuit 23. The data line driving circuit 2 in accordance with this embodiment drives n number of pixels 6 (pixels 6** in one row) lined in the X direction on a line at a time basis in which the data signal DT responsive to the video data VID is fed at a time for one horizontal scanning period.

Each pixel 6 includes a pixel switching element 61 and a capacitor 62. In this embodiment, a TFT (Thin-Film Transistor) is used as the pixel switching element 61. The pixel switching element 61 is connected between the data line **5-*j* and the pixel electrode 106. The pixel switching element 61 is turned on when the scanning line 4-*i*, to which the gate of the pixel switching element 61 is connected, is selected, specifically, when a scanning signal Gi supplied to the scanning 4-*i*** remains at an active level (at a high level).

The capacitor 62 of each pixel 6 is formed of a liquid-crystal capacitor 621 and a storage capacitor 622. The liquid-crystal capacitor 621 is formed of the liquid crystal 105 sandwiched between the pixel electrodes 106 and the counter electrode 107. The storage capacitor 622 has one electrode thereof connected to the pixel electrode 106, and the other electrode connected to a capacitive line 108 (connected to a low-voltage side of a power source, for example) supplied with a constant voltage. The storage capacitor 622 prevents the charge stored in the liquid-crystal capacitor 621 from being leaked.

When the data line driving circuit 2 outputs the data signal DT to the data line **5-*j* with the pixel switching element 61 turned on, the voltage of the data signal DT is fed to the pixel electrodes 106, and a charge responsive to the voltage is stored in the liquid-crystal capacitor 621 and the storage capacitor 622. When the pixel switching element 61 is turned on with the charge responsive to the data signal DT stored in the capacitor 62, a voltage responsive to the charge stored in the liquid-crystal capacitor 621 of the pixel 6 and the storage capacitor 622 is output to the data line 5-*j***.

The test circuit 3 outputs the voltage responsive to the charge stored in each capacitor 62 to the external device, and includes a shift register 32 having n number of stages corresponding to the n number of data lines 5-1, 5-2, . . . , 5-*n*, n number of delay circuits 33-*j* corresponding to the n number of data lines 5-1, 5-2, . . . , 5-*n*, n number of test switching elements 34-*j* ($1 \leqq j \leqq n$), and a reading signal-line 35.

The shift register 32 shifts a test start pulse TSP, which is supplied from the unshown external device via an input terminal 31, in response to a test clock pulse TCK and an inverted test clock pulse TCKB, which is an inverted version of the test clock pulse TCK. The shift register 32 respectively outputs signals Ta1, Ta2, . . . , Tan with the active levels thereof not overlapping each other, to the delay circuits 33-1, 33-2, . . . , 33-*n*. The shift register 32 has two clock feeder lines 321 extending from the input terminal 31 in the X direction, as the wires for the test clock pulse TCK and the inverted test clock pulse TCKB respectively fed thereto.

Each delay circuit 33-*j* delays the respective signal Taj so that the timing of the rising edge of the signal Taj output from the shift register 32 is different from the timing of a level change of the test clock pulse TCK or the inverted test clock pulse TCKB (i.e., the timing of the rising edge or the falling edge of the test clock pulse TCK or the inverted test clock pulse TCKB), and then outputs the delayed signal Taj as Tbj to the test switching element 34-*j*. In this embodiment, the delay circuit 33-*j* delays the signal Taj output from the shift register 32 by a duration of time D equal to one-eighth the period of the test clock pulse TCK (or the inverted test clock pulse TCKB).

Each test switching element 34-*j* is configured with one end thereof connected to the data line 5-*j* and the other end thereof connected to the reading signal-line 35, and is turned on or off in response to a signal Tbj output from the delay circuit 33-*j*. Specifically, when the signal Tbj from the delay circuit 33-*j* is at an active level, the test switching element 34-*j* is turned on. When the test switching element 34-*j* is turned on, the voltage at the data line 5-*j* is output to the reading signal-line 35 through the test switching element 34-*j*.

The reading signal-line 35, extending in the X direction, is connected to one end of each of the test switching elements 34-1, 34-2, . . . , 34-*n*. Referring to FIG. 3, one end of the reading signal-line 35 is shaped into an output terminal 351. The output terminal 351 serves as a terminal that outputs a read signal RS, responsive to the voltage of the reading signal-line 35, to the external device. The output terminal 351 is placed on the end of the test circuit 3 opposite to the input terminal 31. Referring to FIG. 3, the output terminal 351 is placed on the left-hand side of the test circuit 3, while the input terminal 31 is placed on the right-hand side of the test circuit 3. In this arrangement as shown in FIG. 3, there is no need to extend the end of the reading signal-line 35 (the right-hand end thereof in FIG. 3), opposite to the output terminal 351, to the vicinity of the input terminal 31.

<B: Operation of the Embodiments>

The operation of the electro-optical device 100 during testing will now be discussed. In the testing method, the pixel electrodes 106 is supplied with the voltage of the data signal DT responsive to the video data VID, and the charge responsive to the voltage is stored in both the liquid-crystal capacitor 621 and the storage capacitor 622. For simplicity of explanation, all pixels 6 are supplied with the same data signal DT in this embodiment (in other words, the same amount of charge is stored in all capacitors 62). From each pixel 6, the voltage responsive to the charge stored in the capacitor 62 is output to the reading signal-line 35, and the read signal RS responsive to the voltage is output to the external device through the output terminal 351. In response to the read signal RS, the electro-optical device 100 detects the presence or absence of any defect in the pixels 6, the scanning lines 4-1, 4-2, . . . , 4-*m*, and the data lines 5-1, 5-2, . . . , 5-*n*. The process of this operation will now be discussed.

FIG. 4 is a timing chart showing the operation of the electro-optical device 100 in which the voltage of the data signal DT responsive to the video data VID is applied to the pixel electrode 106 of each pixel 6. As shown in FIG. 4, the start pulse SP is supplied to the shift register 21 in the data line driving circuit 2 at the start timing of one horizontal scanning period Ha0. The shift register 21 shifts the start pulse SP in response to the clock signal CLK and the inverted clock signal CLKB, thereby outputting signals Sa1, Sa2, . . . , San with the active levels thereof not overlapping with each other within the horizontal scanning period Ha0. The first latch circuit 22 successively latches the video data VID supplied from the external device at the falling edges of the signals Sa1, Sa2, . . . , San supplied from the shift register 21. At the end of the horizontal scanning period Ha0, the video data VID to be supplied to the pixels 6 on one row is output to the second latch circuit 23 as the signals Sb1, Sb2, . . . , Sbn.

When a scanning signal G1 supplied to the first scanning line 4-1 in FIG. 3 becomes active in the next horizontal scanning period Ha1, the pixel switching elements 61 of the pixels 6 on one row connected to the scanning line 4-1 are all turned on. At the start timing of the horizontal scanning period Ha1, the latch pulse LP is fed to the second latch circuit 23 in the data line driving circuit 2. At the falling edge of the latch pulse LP, the second latch circuit 23 concurrently outputs the signals Sb1, Sb2, . . . , Sbn, which have been successively latched on a point at a time basis by the first latch circuit 22, to the data lines 5-1, 5-2, . . . , 5-*n* as the data signal DT. In parallel with the outputting of the data signal DT, the first latch circuit 22 latches the video data VID, to be supplied to the pixels 6 on one row corresponding to the second scanning line 4-2 from top in FIG. 3, on a point at a time basis.

As described above, a duration of time during which the data signal DT responsive to the video data VID is concurrently output, the pixel switching elements 61 of the first row pixels 6 are turned on. As a result, at this moment, the pixel electrodes 106 of the n number of pixels 6 are supplied with the voltage of the data signal DT output from the data line driving circuit 2. The charge corresponding to the voltage of the data signal DT output from the data line 5-*j* is thus stored in the capacitor 62 of each pixel 6.

These steps of operation are repeated until a scanning signal Gm for a m-th row scanning line 4-*m* is output. As a result, the capacitors 62 of the matrix of pixels 6 of m rows by n columns store charges responsive to the voltage of the data signal DT.

Thereafter, the process to output the voltage responsive to the charge stored in the capacitor 62 to the reading signal-line 35 is executed for each pixel 6. Referring to FIG. 5, this process will now be discussed.

For a horizontal scanning period Hb1 subsequent to the storage of charges, responsive to the data signal DT, in the capacitors 62 in all pixels 6, the scanning signal G1 to be output to the scanning line 4-1 is driven to an active level, and the pixel switching elements 61 of the pixels 6 of one row connected to the scanning line 4-1 are all turned on.

Referring to FIG. 5, the test start pulse TSP is fed to the shift register 32 in the test circuit 3 at the start timing of the horizontal scanning period Hb1. The shift register 32 shifts the test start pulse TSP in response to the test clock pulse TCK and the inverted test clock pulse TCKB, thereby outputting signals Ta1, Ta2, . . . , Tan, with the active levels thereof not overlapping each other within the horizontal scanning period Hb1 respectively to the delay circuits 33-1, 33-2, . . . , 33-*n*.

Referring to FIG. 5, the delay circuits 33-1, 33-2, . . . , 33-*n* respectively delay the signals Ta1, Ta2, . . . , Tan output from the shift register 32 by a duration of time D equal to one-eighth the period of the test clock pulse TCK or the inverted test clock pulse TCKB. The resulting signals Tb1, Tb2, . . . , Tbn are respectively output to the test switching elements 34-1, 34-2, . . . , 34-*n*. Within one horizontal scanning period Hb1 as shown in FIG. 5, the test switching elements 34-1, 34-2, . . . , 34-*n* are selectively successively turned on with a delay time of D subsequent to the level change of the test clock pulse TCK or the inverted test clock pulse TCKB.

As already discussed, the pixel switching elements 61 of the first row pixels 6 are turned on within the horizontal scanning period Hb1. With the signal Tbj driven to an active level, the test switching element 34-*j* is turned on. Output to the reading signal-line 35 via the data line 5-*j* and the test switching element 34-*j* is the voltage responsive to the charge stored in the liquid-crystal capacitor 621 and the storage capacitor 622 for the pixel 6 at the intersection of the data line 5-*j* connected to the test switching element 34-*j* and the first row scanning line 4-1. This operation is repeated each time that each of the test switching elements 34-1, 34-2, . . . , 34-*n* is turned on within the horizontal scanning period Hb1. As a result, each time that each test switching element 34-*j* is turned on, the voltage of the read signal RS becomes a voltage responsive to the charge stored in the capacitor 62 of the pixel 6 located at an intersection of the scanning line 4-1 and the data line 5-*j*. Ideally, a read signal RS' is output from the output terminal 351 to the external device. However, the waveform of the read signal RS' shown in FIG. 5 is idealized. An actual waveform of the read signal RS output from the output terminal 351 contains noise N as shown in FIG. 5. Due to capacitive coupling between each of the clock feeder lines 321 in the shift register 32, to which the test clock pulse TCK and the inverted test clock pulse TCKB are supplied, and the reading signal-line 35, the read signal RS output from the output terminal 351 may contain the noise N generated close to the timing of the level change of the test clock pulse TCK and the inverted test clock pulse TCKB.

When the horizontal scanning period Hb1 ends, a similar operation is repeated in each of the successive horizontal scanning periods Hb2, Hb3, . . . , Hbm. Specifically, for the horizontal scanning period Hbi throughout which the scanning signal Gi remains at an active level, the voltage responsive to the charge stored in the i-th row capacitors 62 corresponding to the scanning line 4*i* (i.e., the voltage applied to the pixel electrodes 106) are successively output to reading signal-line 35 with a delay time D subsequent to the level change of the test clock pulse TCK. As a result, the read signal RS, not only reflecting the voltage output to each pixel 6, but also containing the noise, is output through the output terminal 351.

When this process ends for all capacitors 62, the presence or absence of any defect is checked in the electro-optical device based on the resulting read signal RS. Specifically, the voltage of the read signal RS for the duration of time during which each of the test switching elements 34-1, 34-2, . . . , 34-*n* is turned on is detected. The voltage thus detected is responsive to the charge stored in the capacitor 62 of each of the pixels 6 of m rows by n columns. The presence or absence of any defect in the pixels 6, the scanning lines 4-1, 4-2, . . . , 4-*m*, and the data lines 5-1, 5-2, . . . , 5-*n* is thus detected by comparing the voltage responsive to the charge stored in the capacitor 62 of the pixel 6 with the voltage of the data signal DT supplied to the pixel 6. For example, when the voltage responsive to the charge stored in the capacitor 62 of a given pixel 6 is substantially smaller than the voltage of the data signal DT, it can be determined that the pixel 6 suffers from some form of defect. When the voltage responsive to the charge stored in the capacitors 62 of the pixels 6 of one row are substantially smaller than the voltage of the data signal DT provided to each of the pixels 6, the scanning line 4-*i* connected to these pixels 6 may be defective, for example, with an open circuit. When the voltage responsive to the charge stored in all capacitors 62 of the pixels 6 in one column is compared with the voltage of the data signal DT for these pixels 6, any data line 5-*j* suffering from a defect can be identified. An electro-optical device 100 identified as being defective is treated as a faulty product, while an electro-optical device 100 free from any defect is treated as a good product.

Since the presence or absence of a defect is determined based on the voltage responsive to the charge stored in the capacitor 62 of each pixel 6 in this embodiment, the pixels 6, the scanning lines 4-1, 4-2, . . . , 4-*m*, and the data lines 5-1, 5-2, . . . , 5-*n* in the electro-optical device 100 are accurately tested for defects. Since the voltage responsive to the charge stored in the capacitor 62 of each pixel 6 is output to the reading signal-line 35 on a per pixel basis, any pixel 6 suffering from a defect is specified out of many pixels 6. Similarly, any scanning line 4-*i* or any data line 5-*j*, suffering from a defect, is specified respectively out of many scanning lines 4-1, 4-2, . . . , 4-*m* or out of many data lines 5-1, 5-2, . . . , 5-*n*.

As described above, the read signal RS contains the noise N synchronized with the level change of the test clock pulse TCK and the inverted test clock pulse TCKB. This embodiment of the present invention enables the electro-optical device 100 to accurately be tested without being influenced by the noise. Advantages of the present invention will now be discussed.

A test circuit 3' shown in FIG. 6 is contemplated to perform the same test method described above. The test circuit 3' shown in FIG. 6 is different from the test circuit 3 of this embodiment in that the test circuit 3' is not provided with the delay circuit 33-*j* shown in FIG. 3, that the output signals Ta1, Ta2, . . . , Tan from the shift register 32 are respectively directly fed to the test switching elements 34-1, 34-2, . . . , 34-*n*, and that the output terminal 351 and the input terminal 31 of the shift register 32 are placed on the same side of the test circuit 3' (see FIG. 3).

When the voltage responsive to the charge stored in the capacitor 62 is output to the reading signal-line 35 by using the test circuit 3', the waveform of each signal is shown in FIG. 7. Since a signal Ta-j directly supplied by the shift register 32 controls the test switching element 34-*j* for the on and off operation in the test circuit 3', the timing that the test switching element 34-*j* switches from the off state to the on state (i.e., at the timing that the signal Ta-j is transitioned to an active level) approximately coincides with the timing of the level change of the test clock pulse TCK. Specifically, the timing of outputting the voltage from the capacitor 62 to the reading signal-line 35 becomes close to the timing of the level change of the test clock pulse TCK. As a result, the voltage output from the capacitor 62 overlaps the noise N in the signal RS" output to the output terminal 351. This arrangement presents difficulty in accurately detecting the voltage responsive to the charge stored in each capacitor 62, thereby impeding accurate testing.

In the test circuit 3 of this embodiment, the delay circuit 33-*j* connected between the shift register 32 and the test switching element 34-*j* differentiates the timing that the test switching element 34-*j* is turned on and the timing of the level change of the test clock pulse TCK. Referring to FIG. 5, the voltage output from each capacitor 62 does not overlap the noise N in the read signal RS. The voltage responsive to the charge stored in the capacitor 62 is accurately detected. The test circuit 3 permits more accurate testing than the test circuit 3' shown in FIG. 6.

Since the output terminal 351 and the input terminal 31 are placed on the same side of the shift register 32 in the test circuit 3' shown in FIG. 6, the reading signal-line 35 needs to extend close to the input terminal 31. The reading signal-line 35 and each of the clock feeder lines 321 are forced to run in parallel with each other for a relatively long distance, and the noise N caused by capacitive coupling in this area increases.

In this embodiment, the output terminal 351 is arranged on the side of the test circuit 3 opposite to the input terminal 31. Referring to FIG. 3, the extended portion of the reading signal-line 35 running toward the input terminal 31 can thus be shortened. In other words, the portion that contributes to capacitive coupling is shortened. In comparison with the arrangement shown in FIG. 6, the noise in the read signal RS is low, and accurate testing is thus performed.

<C: Modifications>

The one embodiment of the present invention discussed above is illustrative only, and various modifications of the present invention are possible without departing from the scope of the present invention. The following modifications are contemplated, for example.

(1) In the above-referenced embodiment, the test method is intended to test the electro-optical device 100 in which the element substrate 101 and the counter substrate 102 are bonded with the sealing member 104 interposed therebetween, and the liquid crystal 105 is encapsulated between the two substrates. The test method may be applied to a electro-optical device 100 (the element substrate 101) prior to the step of bonding the two substrates. In this case, however, the liquid-crystal capacitor 621 is not yet produced (i.e., only the pixel electrodes 106 is formed), the storage capacitor 622 of each pixel 6 is used in the test. Specifically, the data signal DT is output to the pixel 6 from the data line driving circuit 2 so that the voltage responsive to the data signal DT is applied to the pixel electrodes 106 of the pixel 6. The charge responsive to the voltage is thus stored in the storage capacitor 622. The voltage responsive to the charge stored in the storage capacitor 622 (i.e., the voltage applied to the pixel electrodes 106) is output to the reading signal-line 35 on a pixel by pixel basis, and is then output from the output terminal 351 as the read signal RS. The same advantages as those of the above embodiment are also provided in this modification. Since the presence or absence of a defect in the pixels 6 is detected prior to the step of bonding the two substrates and the encapsulation of the liquid crystal 105 in accordance with this modification, manufacturing costs are reduced.

In accordance with the present invention, it is not a requirement that a charge responsive to the data signal DT be stored in the capacitor 62 that is formed of both liquid-crystal capacitor 621 and the storage capacitor 622. It is important that the voltage responsive to the data signal DT is applied to the pixel electrodes 106 and that this voltage is output to the reading signal-line 35.

(2) In the electro-optical device 100 of the above-referenced embodiment, the data line driving circuit 2 is connected to the one end of each data line 5-*j*. Alternatively, the present invention is applied to a electro-optical device 100 in which a first data line driving circuit 2*a* is connected to one end of each data line 5-*j* while a second data line driving circuit 2*b* is connected to the other end of each data line 5-*j* as shown in FIG. 8. As shown in FIG. 8, the test circuit 3 of the above-referenced embodiment is arranged between the second data line driving circuit 2*b* and pixels 6 of one row closest to the second data line driving circuit 2*b*. Alternatively, the test circuit 3 may be arranged between the first data line driving circuit 2*a* and the pixels 6 of one row closest to the first data line driving circuit 2*a*.

When the test circuit 3 is arranged straddling a plurality of data lines 5-1, 5-2, . . . , 5-*n* as shown in FIG. 8, each clock feeder line 321 in the shift register 32 in the test circuit 3 crosses each data line 5-*j*. In this arrangement, capacitive coupling takes place not only between the clock feeder lines 321 and the reading signal-line 35 but also between the clock feeder lines 321 and each data line 5-*j*. Noise contained in the read signal RS in the arrangement shown in FIG. 8 becomes greater than that in the arrangement shown in FIG. 3. Even when noise level is high as in this example, the present invention permits accurate testing because the timing of outputting the voltage to the reading signal-line 35 from the capacitor 62 of the pixel 6 is set to be different from the timing of the level change of the test clock pulse TCK or the inverted test clock pulse TCKB. Furthermore, the present invention may be applied to an electro-optical device in which a pair of scanning line driving circuits is arranged on both sides of each scanning line 4-*i*, or an electro-optical device which employs a data line driving circuit working on a point at a time driving method.

(3) In the above-referenced embodiment, the test circuit 3 is arranged on the element substrate 101. Alternatively, a test circuit 3 can be arranged separately from the electro-optical device 100. Referring to FIG. 9, the test circuit 3 is not mounted on an electro-optical device 100, and testing is performed by using a test device 7 incorporating the test circuit 3 shown in the above-referenced embodiment. The test device 7 includes a body 71 housing the test circuit 3, and probes 72. Each probe is electrically connected to one end of each test switching element 34-*j* of the test circuit 3. To perform testing by using the test device 7, the test switching elements 34-*j* are successively turned on with the probes 72 respectively connected to test points 73 which are respective portions of the data lines 5-*j*. The voltage responsive to the charge stored in the capacitor 62 of the pixel 6 is output to the reading signal-line 35. This modification enables testing to be performed in the same way as with the above-referenced embodiment, and provides the same advantages as those of the above-referenced embodiment. This modification eliminates the need to build the test circuit 3 into each electro-optical device 100, and a common test device 7 is used to test a plurality of electro-optical devices 100. Manufacturing costs are thus reduced. The electro-optical device 100 thus becomes more compact by saving the space for the test circuit 3.

(4) In the above-referenced embodiment, the test circuit 3 employs a single reading signal-line 35. The number of reading signal-lines 35 and the number of output terminals 351 are not limited to those used in the above-referenced embodiment. An arrangement as shown in FIG. 10 can also be provided which includes two reading signal-lines 35*a* and

35*b*, an output terminal 351*a* that outputs a read signal RS1 from the reading signal-line 35*a*, and an output terminal 351*b* that outputs a read signal RS2 from the reading signal-line 35*b*. In this arrangement, the reading signal-line 35*a* may be connected to one end of an odd-numbered test switching element 34-*j* from the left-hand side thereof, while the reading signal-line 35*b* may be connected to one end of an even-numbered test switching element 34-*j*+1 from the left-hand side thereof.

(5) In the above-referenced embodiment, the output terminal 351 of the reading signal-line 35 is set to be placed on the end of the shift register 32 opposite to the input terminal 31, and the timing of outputting the voltage from each capacitor 62 to the reading signal-line 35 is set to be different from the timing of the level change of the test clock pulse TCK. Adopting only one of these two settings is also acceptable. Specifically, if sufficiently accurate testing is performed with the effect of noise controlled by only setting the timing of outputting the voltage to the reading signal-line 35 to be different from the timing of the level change of the test clock pulse TCK, there is no need to place the output terminal 351 opposite to the input terminal 31. The converse of this operation is also true.

(6) In the above-referenced embodiment, the shift register 32 is used to successively turn on the test switching elements 34-*j* in the test circuit 3 on a point at a time basis. Alternatively, an address decoder may be used instead of the shift register 32. Specifically, the address decoder outputs an active level signal to the test switching element 34-*j* in response to an address signal fed to one of a plurality of data lines 5-1, 5-2, . . . , 5-*n*. The address decoder thus arbitrarily selects any of the test switching elements 34-*j*. In this case, the level change timing of the address signal that repeatedly changes the level thereof in response to a read address designating one of the test switching elements 34-*j* is set to be different from the timing of outputting the voltage from the capacitor 62 (i.e., the timing at which the test switching element 34-*j* is turned on). The "action command signal" in the context of the present invention is not limited to a clock signal that repeatedly changes the level thereof with a constant period, and refers to a concept that includes the above-referenced address signal. Specifically, the "action command signal" refers to a signal which repeatedly changes the level thereof, and defines the operation of the test circuit.

In the above-referenced embodiment, the delay circuit 33-*j* is used to set the timing of turning on the test switching element 34-*j* to be different from the timing of the level change of the test clock pulse TCK. The structure to perform such a function is not limited to the delay circuit 33-*j*.

The structure of the test circuit 3 is not limited to the above-referenced embodiment and the above-referenced modifications. The "test circuit" of the present invention may have any structure as long as the test circuit operates in response to the action command signal, and outputs the voltage responsive to the charge stored in the capacitor 62 of the pixel 6 to the reading signal-line 35 at a timing different from the timing of the level change of the action command signal.

(7) In the above-referenced embodiment, the delay time D caused by the delay circuit 33-*j* is set to be a duration of time equal to one-eighth the period of the test clock pulse TCK. The delay time D may be set to a different time length. It is important that the timing of outputting the voltage from each capacitor 62 be set to be different from the timing of the level change of the test clock pulse TCK so that the voltage responsive to the charge stored in the capacitor 62 of each pixel 6 is picked up from the read signal RS containing noise. Any time difference between the two timings is sufficient.

When the delay time D is set to be half the period of the test clock pulse TCK, the timing of outputting the voltage from the capacitor 62 coincides with the timing of the level change of the test clock pulse TCK (i.e., the timing of noise generation) as shown in FIG. 7. Referring to FIG. 5 and FIG. 7, the noise N has a predetermined width along the time axis. In view of these points, the delay time D preferably falls within a range from one-eighth to one-quarter the period of the test clock pulse TCK to assure testing accuracy without being influenced by the noise.

In the above-referenced embodiment, the charge responsive to the data signal DT is stored in the capacitors 62 of all pixels 6 of m rows by n columns. Alternatively, charge may only be stored in some pixels 6. Alternatively, different voltages of the data signal DT may be fed to different pixels 6 so that different charges are stored in different capacitors 62.

(8) In the above-referenced embodiment, the electro-optical device 100 is a liquid-crystal device. The present invention is not limited to the liquid-crystal device. Besides the liquid-crystal device, the present invention may be applied to an electroluminescent (EL) device, or any of various other electro-optical devices that present a display using the electro-optical effect, for example, using phosphorescence by plasma emission or electron emission. The electro-optical material may include the EL, a mirror device, gas, and phosphor, for instance. When the EL is used as the electro-optical device, the EL is interposed between the pixel electrodes 106 on the element substrate 101 and the counter electrode 107, and the counter substrate 102, which is required in the liquid-crystal device, is obviated.

<D: Electronic Equipment>

Several pieces of electronic equipment incorporating the electro-optical device of the above-referenced embodiment will now be discussed.

<1: Mobile Computer>

FIG. 11 shows an example in which the above-referenced electro-optical device 100 is incorporated in a mobile personal computer 400. As shown, the mobile personal computer 400 includes a main unit 402 with a keyboard 401, and the electro-optical device 100 as a display unit. A backlight unit (not shown) is arranged behind the electro-optical device 100 to enhance visibility of an image.

<2: Mobile Telephone>

FIG. 12 shows a mobile telephone in which the electro-optical device 100 is incorporated as a display unit. As shown, the mobile telephone 410 includes a plurality of control buttons 411, an ear piece 412, a mouth piece 413, and the electro-optical device 100.

Since accurate testing is performed to detect presence or absence of a defect in each pixel, the scanning lines, and the data lines in the electro-optical device of the present invention, the electronic equipment incorporating the electro-optical device is highly reliable. Besides the mobile computer and the mobile telephone, electronic equipment to which the present invention is applicable may include a liquid-crystal display television, a viewfinder type or direct monitoring type video cassette recorder, a car navigation system, a pager, an electronic pocketbook, an electronic tabletop calculator, a word processor, a workstation, a video phone, a POS terminal, a digital still camera, an apparatus having a touch panel, and a projector having the electro-optical device as a light valve, for example.

As described above, in accordance with the present invention, accurate testing is performed to detect presence or absence of a defect in the wiring and the electrodes in the electro-optical device.

What is claimed is:

1. A test method for testing an electro-optical device using a test circuit which operates in response to an action command signal periodically changing a level thereof, the electro-optical device including a pixel electrode which is arranged at an intersection of each of scanning lines and each of data lines and serves as one electrode of a capacitor, and a pixel switching element connected between the pixel electrode and the data line, the method comprising:

supplying the pixel electrode with a data signal by turning on the pixel switching element;

turning on a test switching element connected between the pixel electrode and the data line at a timing delayed from a timing of a level change of the action command signal in the course of outputting a voltage supplied to the pixel electrode to a reading signal-line by using the test circuit; and determining whether the voltage output to the reading signal-line corresponds to a voltage responsive to the data signal supplied to the pixel electrode.

2. A test circuit for testing an electro-optical device including a pixel electrode which is arranged at an intersection of each of scanning lines and each of data lines and serves as one electrode of a capacitor, and a pixel switching element connected between the pixel electrode and the data line, the test circuit outputting a voltage supplied to the pixel electrode to a reading signal-line after supplying a data signal to the pixel electrode by turning on the pixel switching element, in order to determine whether the voltage supplied to the pixel electrode corresponds to a voltage responsive to the data signal, the test circuit comprising:

a test switching element connected between the data line and the reading signal-line; and a control circuit which operates in response to an action command signal periodically changing a level thereof, and which turns on the test switching element at a timing delayed from a timing of a level change of the action command signal.

3. The test circuit for testing an electro-optical device according to claim 2, the control circuit turning on the test switching element at a timing delayed from the timing of the level change of the action command signal by a duration of time falling within a range from one-eighth to one-quarter the period of the action command signal.

4. The test circuit for testing an electro-optical device according to claim 2, further including an input terminal that inputs the action command signal to the control circuit and an output terminal of the reading signal-line, the input and output terminals being arranged on opposed ends of the control circuit.

5. The test circuit for testing an electro-optical device according to claim 2, the control circuit including an output device that outputs a control signal that changes the level thereof in response to the action command signal, and a timing modification device that delays a timing of a level change of the control signal from the timing of the level change of the action command signal.

6. The test circuit for testing an electro-optical device according to claim 5, the timing modification device being a delay device.

7. A test circuit for testing an electro-optical device including a pixel electrode which is arranged at an intersection of each of scanning lines and each of data lines and serves as one electrode of a capacitor, and a pixel switching element connected between the pixel electrode and the data line, the test circuit outputting a voltage supplied to the pixel electrode to a reading signal-line after supplying a data signal to the pixel electrode by turning on the pixel switching element, in order to determine whether the voltage supplied to the pixel electrode corresponds to a voltage responsive to the data signal, the test circuit comprising:

a test switching element connected between the data line and the reading signal-line;

a control circuit which turns on the test switching element in response to an action command signal periodically changing a level thereof;

an input terminal that inputs the action command signal to the control circuit; and an output terminal, arranged at an end of the control circuit opposite to the input terminal, that outputs a voltage of the reading signal-line.

8. An electro-optical device, comprising:

scanning lines;

data lines intersecting the scanning lines;

a pixel electrode which is arranged at the intersection of each of the scanning lines and each of the data lines, the pixel electrode serving as one electrode of a capacitor;

a pixel switching element connected between the pixel electrode and the data line;

a reading signal-line; and a test circuit which outputs a voltage, supplied to the pixel electrode, to the reading signal-line after supplying a data signal to the pixel electrode by turning on the pixel switching element, in order to determine whether the voltage supplied to the pixel electrode corresponds to a voltage responsive to the data signal, the test circuit including:

a test switching element connected between the data line and the reading signal-line; and a control circuit which operates in response to an action command signal periodically changing a level thereof, and which turns on the test switching element at a timing delayed from a timing of a level change of the action command signal.

9. The electro-optical device according to claim 8, the control circuit turning on the test switching element at a timing delayed from the timing of the level change of the action command signal by a duration of time falling within a range from one-eighth to one-quarter the period of the action command signal.

10. The electro-optical device according to claim 8, further including an input terminal that inputs an action command signal to the control circuit and an output terminal, arranged at an end of the control circuit opposite to the input terminal, that outputs a voltage of the reading signal-line.

11. The electro-optical device according to claim 8, the capacitor being formed of the pixel electrode serving as one electrode, a counter electrode serving as the other electrode, and an electro-optical material sandwiched between the one electrode and the other electrode.

12. The electro-optical device according to claim 8, further including a storage capacitor having one electrode thereof connected to the pixel electrode and the other electrode thereof connected to a capacitive line.

13. The electro-optical device according to claim 8, the control circuit including an output device that outputs a control signal that changes the level thereof in response to the action command signals, and a timing modification device that delays the timing of the level change of the control signal from the timing of the level change of the action command signal.

14. The electro-optical device according to claim 13, the timing modification device being a delay device.

15. A piece of electronic equipment, comprising:

the electro-optical device according to claim 8.

16. An electro-optical device, comprising:

scanning lines;

data lines intersecting the scanning lines;

a pixel electrode arranged at the intersection of each of the scanning lines and each of the data lines, the pixel electrode serving as one electrode of a capacitor;

a pixel switching element connected between the pixel electrode and the data line;

a reading signal-line; and a test circuit which outputs a voltage supplied to the pixel electrode to the reading signal-line after supplying a data signal to the pixel electrode by turning on the pixel switching element, in order to determine whether the voltage supplied to the pixel electrode corresponds to a voltage responsive to the data signal, the test circuit including:

a test switching element connected between the data line and the reading signal-line;

a control circuit which turns on the test switching element in response to an action command signal periodically changing the level thereof;

an input terminal that inputs the action command signal to the control circuit; and an output terminal, arranged at an end of the control circuit opposite to the input terminal, that outputs a voltage of the reading signal-line.

* * * * *